United States Patent
Kodama et al.

(10) Patent No.: US 12,120,860 B2
(45) Date of Patent: Oct. 15, 2024

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hiroyuki Kodama, Mie (JP); Kiyoshi Kato, Mie (JP); Yuya Iwaguchi, Mie (JP); Shuhei Ozu, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 243 days.

(21) Appl. No.: 17/802,418

(22) PCT Filed: Feb. 26, 2021

(86) PCT No.: PCT/JP2021/007345
§ 371 (c)(1),
(2) Date: Aug. 25, 2022

(87) PCT Pub. No.: WO2021/177162
PCT Pub. Date: Sep. 10, 2021

(65) Prior Publication Data
US 2023/0086631 A1    Mar. 23, 2023

(30) Foreign Application Priority Data
Mar. 4, 2020   (JP) .................................. 2020-036767

(51) Int. Cl.
*H05K 9/00* (2006.01)
*B60R 16/02* (2006.01)
*H01P 3/06* (2006.01)

(52) U.S. Cl.
CPC ....... *H05K 9/0075* (2013.01); *B60R 16/0207* (2013.01); *H01P 3/06* (2013.01); *H05K 9/0098* (2013.01)

(58) Field of Classification Search
CPC . B60R 16/0207; H05K 9/0098; H05K 9/0075
See application file for complete search history.

(56) References Cited

U.S. PATENT DOCUMENTS 10,964,448 B1 * 3/2021 Wright .................. H01B 3/421
2004/0032360 A1   2/2004 Hosoe et al.
(Continued)

FOREIGN PATENT DOCUMENTS

JP   2005-333244 A   12/2005
JP   2007-172847 A    7/2007
(Continued)

OTHER PUBLICATIONS

International Search Report issued on May 11, 2021 for WO 2021/177162 A1 (4 pages).

*Primary Examiner* — Hung V Ngo
(74) *Attorney, Agent, or Firm* — Venjuris, P.C.

(57) ABSTRACT

The present disclosure is directed to achieve greater space efficiency. A wiring module (A) includes a first transmission line (20), and a noise shielding member (40) that has a sheet shape and is arranged along the first transmission line (20). The noise shielding member (40) has a thickness of 100 μm to 600 μm. Since the noise shielding member (40) has a sheet shape, and thus the space for arranging the noise shielding member (40) can be made smaller, it is possible to achieve greater space efficiency. Since the noise shielding member (Continued)

(40) has a thickness of 100 μm to 600 μm, it is possible to obtain a high noise shielding effect.

3 Claims, 4 Drawing Sheets

(56) References Cited

U.S. PATENT DOCUMENTS

| | | | | |
|---|---|---|---|---|
| 2012/0090873 A1* | 4/2012 | Gundel | ................ | H05K 9/0098 |
| | | | | 174/113 R |
| 2013/0333936 A1* | 12/2013 | Gundel | .................... | H01B 9/02 |
| | | | | 174/350 |
| 2015/0217708 A1* | 8/2015 | Adachi | ................ | H02G 3/0468 |
| | | | | 174/72 A |
| 2017/0301431 A1* | 10/2017 | Li | ........................ | H01B 11/203 |
| 2018/0277282 A1 | 9/2018 | Mizutani | | |
| 2019/0214164 A1* | 7/2019 | Chung | .................... | H01R 24/20 |
| 2020/0112115 A1* | 4/2020 | Vana, Jr. | ............... | H01R 12/771 |
| 2022/0158336 A1* | 5/2022 | Sone | ........................ | H01Q 1/40 |
| 2022/0285048 A1* | 9/2022 | Lanoe | .................... | H05K 9/0098 |
| 2023/0092806 A1* | 3/2023 | Kato | .................... | B60R 16/0215 |

FOREIGN PATENT DOCUMENTS

| | | |
|---|---|---|
| JP | 2007-281074 A | 10/2007 |
| JP | 2008-197842 A | 8/2008 |
| JP | 2017-033837 A | 2/2017 |
| JP | 2017-147307 A | 8/2017 |
| JP | 2019-165520 A | 9/2019 |

* cited by examiner

WIRING MODULE

CROSS REFERENCE TO RELATED APPLICATIONS

This application is a national phase of PCT application No. PCT/JP2021/007345, filed on 26 Feb. 2021, which claims priority from Japanese patent application No. 2020-036767, filed on 4 Mar. 2020, all of which are incorporated herein by reference.

TECHNICAL FIELD

The present disclosure relates to a wiring module.

BACKGROUND

Patent Document 1 discloses a technology for removing electromagnetic noise caused by a core wire using a magnetic core that is provided around the core wire.

PRIOR ART DOCUMENT

Patent Document

Patent Document 1: JP 2017-147307 A

SUMMARY OF THE INVENTION

Problems to be Solved

In the technology above, the magnetic core has a tubular shape, and therefore, a large space for arranging the magnetic core needs to be provided around the core wire. A wiring module of the present disclosure was accomplished based on the circumstances as mentioned above, and it is an object thereof to achieve greater space efficiency.

Means to Solve the Problem

A wiring module of the present disclosure includes:
a transmission line; and
a noise shielding member that has a sheet shape and is arranged along the transmission line,
wherein the noise shielding member has a thickness of 100 μm to 600 μm.

Effect of the Invention

With the present disclosure, it is possible to achieve greater space efficiency.

DETAILED DESCRIPTION TO EXECUTE THE INVENTION

Description of Embodiments of the Present Disclosure

First, embodiments of the present disclosure will be listed and described.

A wiring module of the present disclosure includes:
(1) a transmission line; and a noise shielding member that has a sheet shape and is arranged along the transmission line, wherein the noise shielding member has a thickness of 100 μm to 600 μm. With the configuration of the present disclosure, the noise shielding member has a sheet shape, and thus the space for arranging the noise shielding member can be made smaller, thus making it possible to achieve greater space efficiency. The noise shielding member has a thickness of 100 μm to 600 μm, thus making it possible to obtain a high noise shielding effect.

(2) It is preferable that the noise shielding member has a thickness of 200 μm to 400 μm. With this configuration, it is possible to obtain a higher noise shielding effect.

(3) It is preferable that the noise shielding member includes a magnetic material having such magnetic characteristics that an imaginary part of complex magnetic permeability between 1 GHz to 5 GHz is at least 5. With this configuration, electromagnetic noise caused by the transmission line is absorbed due to the magnetic loss of the magnetic material, thus making it possible to obtain a high noise shielding effect.

(4) In (3), it is preferable that the magnetic material has such magnetic characteristics that an imaginary part of complex magnetic permeability at a frequency of 1 GHz is at least 10. With this configuration, it is possible to obtain a higher noise shielding effect.

Details of Embodiments of the Present Disclosure

Embodiment 1

Embodiment 1 in which a wiring module A of the present disclosure is embodied will be described with reference to FIGS. 1 to 4. It should be noted that the present invention is not limited to this embodiment and is defined by the scope of the appended claims, and all changes that fall within the same essential spirit as the scope of the claims are intended to be included therein. In Embodiment 1, as for the vertical direction, the upper side and the lower side shown in FIGS. 2 and 3 are defined as the upper side and the lower side as-is.

Figure 2:
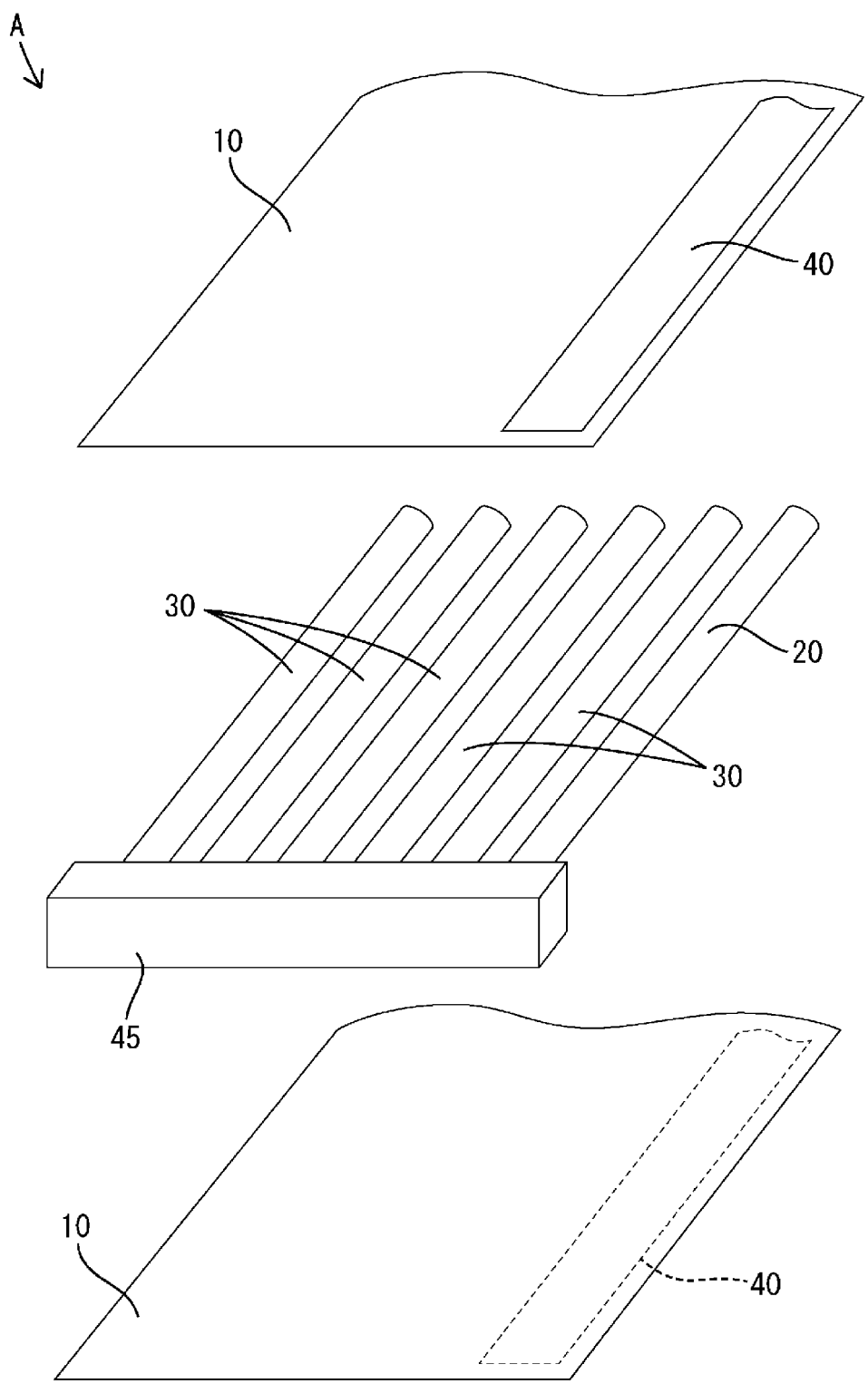
FIG. 2 is an exploded perspective view of the wiring module.
Figure 3:
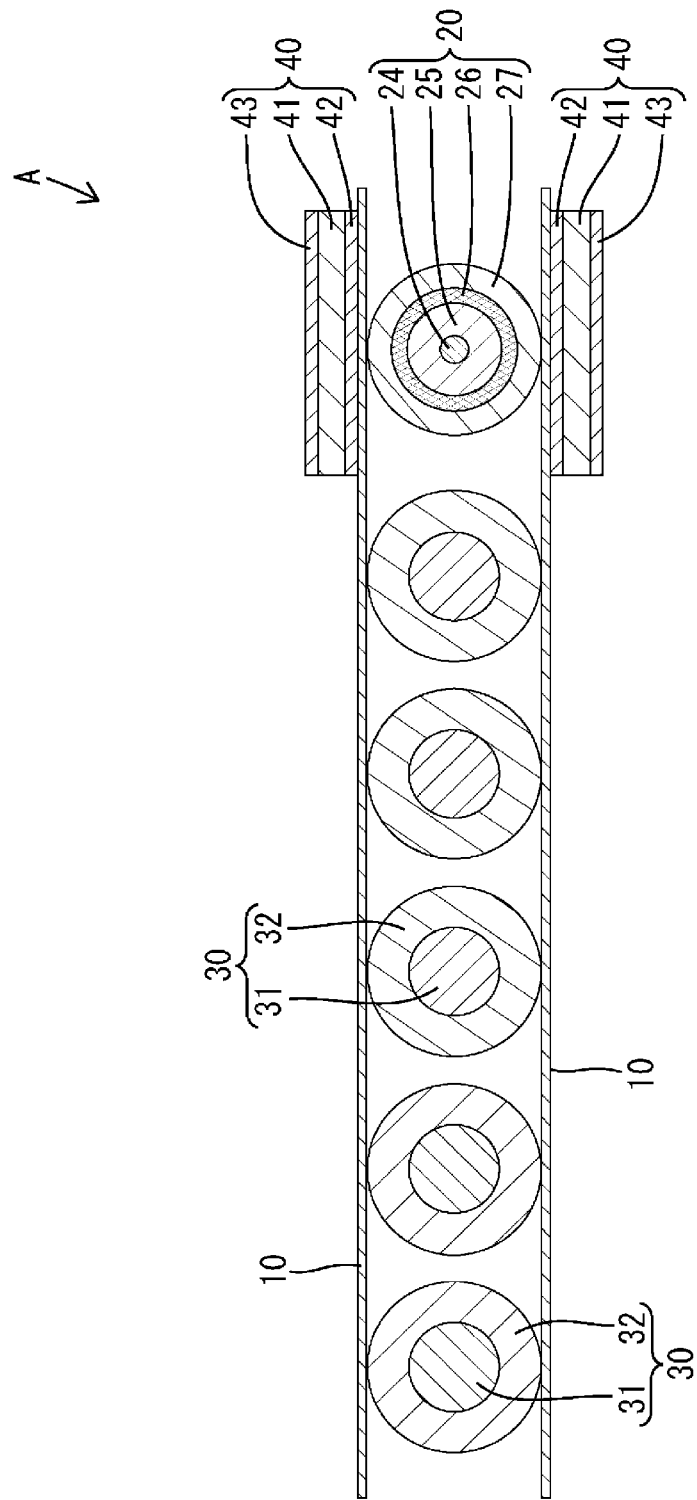
FIG. 3 is a cross-sectional view of the wiring module.

As shown in FIG. 2, the wiring module A of Embodiment 1 includes a pair of sheet materials 10, one first transmission line 20, a plurality of second transmission lines 30, a plurality of connectors 45, and a pair of noise shielding members 40. The wiring module A is to be attached to a vehicle body (not illustrated). Examples of the attachment target of the wiring module A in the body include a roof and a door panel. The wiring module A is connected, for example, between an external antenna (not illustrated) attached to the roof and an ECU (electronic control unit).

Figure 1:
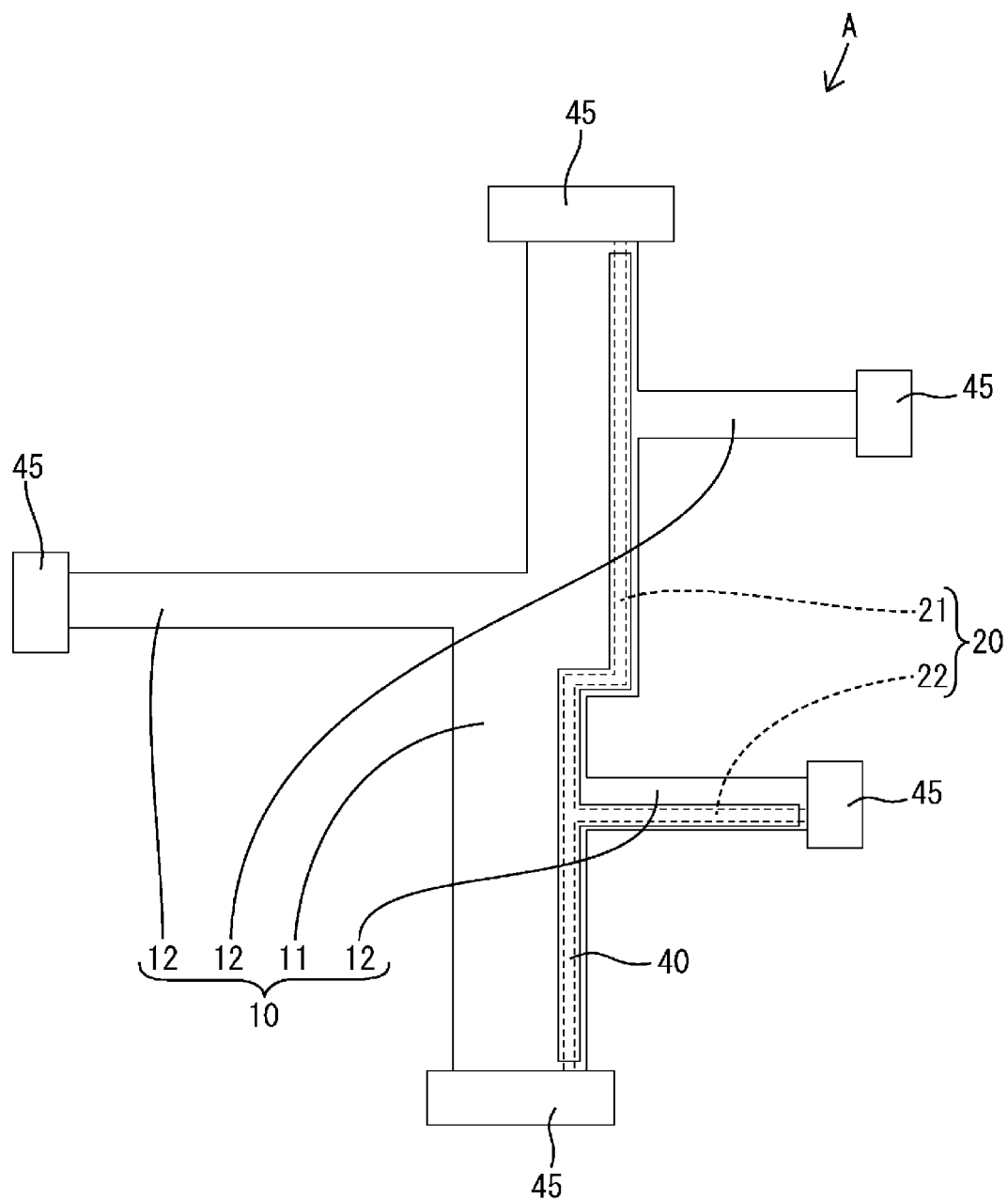
FIG. 1 is a plan view of a wiring module of Embodiment 1.

The pair of sheet materials 10 are made of a flexible synthetic resin material. A resin material such as PVC (polyvinyl chloride) is used to form the sheet materials 10. A resin material capable of being welded to a sheath 27 of the first transmission line 20 and insulation coatings 32 of the second transmission lines 30, which will be described later, with high strength is selected as the resin material for the sheet materials 10. As shown in FIG. 1, each of the sheet materials 10 includes one main-line wiring portion 11, and branch-line wiring portions 12 that branch off and protrude from the side edge portions of the main-line wiring portion 11. In the descriptions below, it is assumed that the sheet materials 10 are arranged in horizontal positions for convenience.

As shown in FIG. 2, the first transmission line 20 and the second transmission lines 30 are routed in horizontal positions between the upper and lower sheet materials 10. As shown in FIG. 1, the first transmission line 20 includes a main line portion 21 routed along the main-line wiring portion 11, and a branch line portion 22 routed along the branch-line wiring portion 12. Although not shown in FIG. 1, each of the second transmission lines 30 also includes a main line portion (not illustrated) routed along the main-line wiring portion 11, and a branch line portion (not illustrated) routed along the branch-line wiring portion 12.

The first transmission line 20 is a conductive path for a communication circuit, and is thus constituted by a coaxial cable. As shown in FIG. 3, the coaxial cable includes a conductor 24, a tubular insulator 25 that surrounds the conductor 24, a shielding layer 26 constituted by a braided wire or the like that surrounds the outer circumference of the insulator 25, and a cylindrical sheath 27 that surrounds the shielding layer 26. The sheath 27 is made of PVC (polyvinyl chloride).

The first transmission line 20 transmits, for example, a signal received by the external antenna (not illustrated) attached to the roof to the ECU at a high speed of 1 Gbps or more. An electric current of a high frequency of 1 GHz or more flows through the first transmission line 20. High-frequency electric currents cause common mode noise and the like. Accordingly, in the first transmission line 20, the coaxial cable is used to taking measures against electromagnetic noise, and the noise shielding members 40 are also provided in order to increase the reliability of the measures against the noise.

As shown in FIG. 3, the second transmission lines 30 have a configuration in which a cylindrical insulation coating 32 surrounds the outer circumference of a core wire 31. As in the case of the sheath 27 of the first transmission line 20, the insulation coating 32 is made of PVC (polyvinyl chloride). The second transmission lines 30 are used as conductive paths for electric power supply and the like. Measures against electromagnetic noise need not be taken for the second transmission lines 30.

In the main-line wiring portions 11 of the sheet materials 10, the main line portion 21 of the first transmission line 20 and the main line portions (not illustrated) of the second transmission lines 30 are routed so as to extend in parallel with one another. In the branch-line wiring portions 12, the branch line portion 22 of the first transmission line 20 and the branch line portion (not illustrated) of the second transmission line 30 extend in parallel with each other, or only the branch line portion 22 of the first transmission line 20 is routed, or only the branch line portion (not illustrated) of the second transmission line 30 is routed.

The noise shielding members 40 have a sheet shape and are flexible. As shown in FIG. 1, the noise shielding members 40 have an elongated shape with a branch at an intermediate portion and extend along the main line portion 21 and the branch line portion 22 of the first transmission line 20. As shown in FIG. 3, the noise shielding members 40 are formed by successively stacking a thin-film magnetic layer 41, a thin-film weld layer 42, and a thin-film protective layer 43. The magnetic layer 41 is sandwiched between the weld layer 42 and the protective layer 43. Note that, in FIG. 3, the thicknesses of the magnetic layer 41, the weld layer 42, and the protective layer 43 are exaggerated for convenience. As in the cases of the sheath 27 of the first transmission line 20 and the insulation coatings 32 of the second transmission lines 30, the weld layer 42 is made of PVC (polyvinyl chloride). The protective layer 43 is made of PET (polyethylene terephthalate).

When the wiring module A is manufactured, the first transmission line 20 and the second transmission lines 30 are routed on a horizontal jig (not illustrated) so as to extend along predetermined wiring paths, one of the sheet materials 10 is placed thereon, and one of the noise shielding members 40 is layered on this sheet material 10. At this time, the noise shielding member 40 extends along only the routing path of the first transmission line 20. In this state, ultrasonic welding is performed. In the process of the ultrasonic welding, the sheet material 10 and the sheath 27 of the first transmission line 20 are welded to each other, the sheet material 10 and the insulation coatings 32 of the second transmission lines 30 are welded to each other, and the weld layer 42 of the noise shielding member 40 and the sheet material 10 are welded to each other. These welding processes are performed in one step.

The first transmission line 20, the second transmission lines 30, the one sheet material 10, and the one noise shielding member 40, which have been integrated as mentioned above, are turned upside down. Then, the other sheet material 10 is placed on the first transmission line 20 and the second transmission lines 30, and the other noise shielding member 40 is layered on this sheet material 10. At this time, the noise shielding member 40 also extends along only the routing path of the first transmission line 20. Thereafter, ultrasonic welding is performed in the same manner as mentioned above, and the first transmission line 20, the second transmission lines 30, the other sheet material 10, and the other noise shielding member 40 are thus fixed and integrated. The wiring module A is thus completed.

The wiring module A of Embodiment 1 includes the first transmission line 20, and the noise shielding members 40 that have a sheet shape and are arranged along the first transmission line 20. Since the noise shielding member 40 has a sheet shape, the space for arranging the noise shielding member 40 can be made smaller. This makes it possible to achieve greater space efficiency.

The magnetic layer 41 included in the noise shielding member 40 has a thickness of 100 μm to 600 μm. A high noise shielding effect can be obtained due to the thickness set as mentioned above. Setting the thickness of the noise shielding member 40 to 200 μm to 400 μm makes it possible to obtain a higher noise shielding effect.

The magnetic layer 41 included in the noise shielding member 40 is formed by dispersing powder of a soft magnetic material such as ferrite, electromagnetic pure iron, or silicon iron in a synthetic resin and mixing them. The complex magnetic permeability (μ), which is one of the magnetic characteristics, of the magnetic material constituting the magnetic layer 41 is represented as follows: $\mu=\mu'-j\mu''$. Here, $\mu'$ is a real component (real part of the magnetic permeability) indicating the magnetic flux convergence characteristics. $\mu''$ is an imaginary component (imaginary part of the magnetic permeability) indicating the magnetic flux attenuation characteristics. j represents an imaginary unit. The higher the magnetic loss component represented by the imaginary component $\mu''$ is, the more effectively improved the noise suppressing performance and the noise shielding performance are. The magnetic layer 41 eliminates high-frequency electromagnetic noise by converting the high-frequency electromagnetic noise into heat due to magnetic loss.

Figure 4:
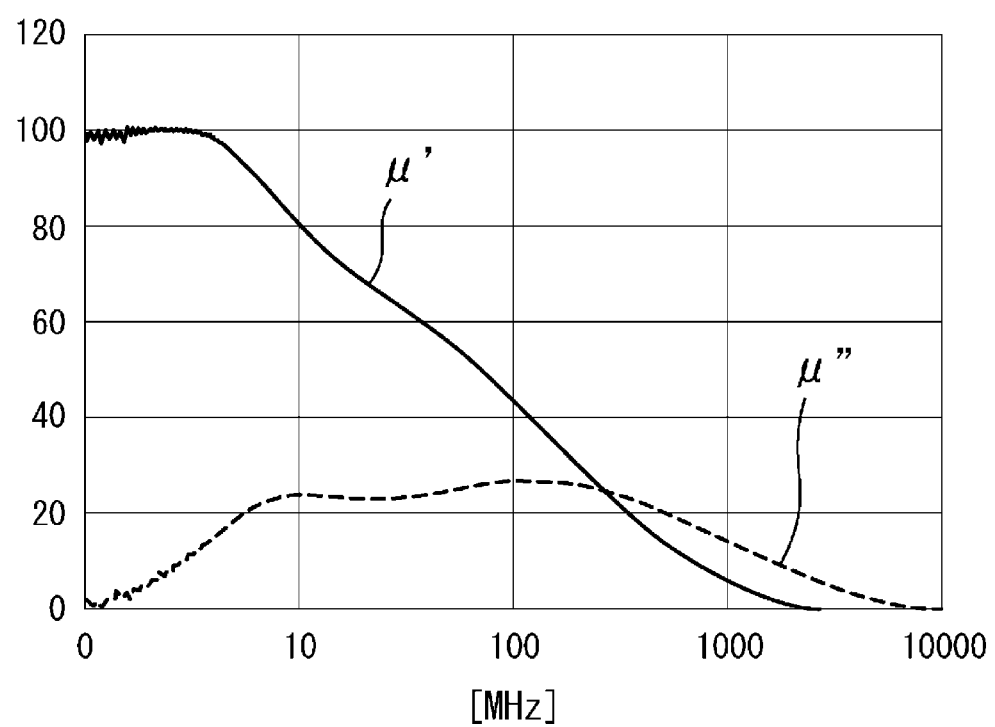
FIG. 4 is a graph illustrating the magnetic characteristics of a magnetic material included in a noise shielding member.

The graph shown in FIG. 4 illustrates the magnetic characteristics of the magnetic material included in the magnetic layer 41 of Embodiment 1. In this graph, the horizontal axis indicates the frequency of an electric current flowing through the first transmission line 20, and the unit thereof is MHz. The vertical axis indicates the values of the real component μ' and the imaginary component μ". As shown in the graph in FIG. 4, the magnetic layer 41 has such magnetic characteristics that the imaginary component of the complex magnetic permeability between 1 GHz to 5 GHz is at least 5. The magnetic layer 41 having such magnetic characteristics absorbs electromagnetic noise caused by the first transmission line 20 due to the magnetic loss of the magnetic material, thus making it possible to obtain a high noise shielding effect. When the imaginary component of the complex magnetic permeability of the magnetic material at a frequency of 1 GHz is at least 10, it is possible to obtain a higher noise shielding effect.

OTHER EMBODIMENTS

The present invention is not limited to the embodiment described in the description above and the drawings, and is defined by the scope of the appended claims. All changes that fall within the same essential spirit as the scope of the claims are included in the present invention, and the following embodiments are also intended to be included therein.

Although the sheet material is provided between the noise shielding member and the transmission line in the embodiment above, the noise shielding member may also be fixed directly to the transmission line.

Although the sheet-shaped conductive path in which the plurality of transmission lines are routed along the sheet material is formed in the embodiment above, the present disclosure can also be applied to a conductive path in which one noise shielding member is arranged along one transmission line without using the sheet member.

Although the material of the sheath of the first transmission line is PVC (polyvinyl chloride) in the embodiment above, the sheath may also be made of a material other than PVC.

Although the material of the weld layer of the noise shielding member is PVC (polyvinyl chloride) in the embodiment above, the weld layer may also be made of a material other than PVC.

LIST OF REFERENCE NUMERALS

A: Wiring module
10: Sheet material
11: Main-line wiring portion
12: Branch-line wiring portion
20: First transmission line (transmission line)
21: Main line portion
22: Branch line portion
24: Conductor
25: Insulator
26: Shielding layer
27: Sheath
30: Second transmission line
31: Core wire
32: Insulation coating
40: Noise shielding member
41: Magnetic layer
42: Weld layer
43: Protective layer
45: Connector
μ: Complex magnetic permeability
μ': Real component
μ": Imaginary component

What is claimed is:

1. A wiring module comprising:
a first transmission line and a second transmission line that extend along predetermined wiring paths;
a noise shielding member that extends along only the wiring path of the first transmission line; and
a sheet material,
wherein the first transmission line is constituted by a coaxial cable,
the noise shielding member has a sheet shape, and is separate from the first transmission line, and
the noise shielding member is layered on the sheet material, and then the first transmission line, the second transmission line, the sheet material, and the noise shielding member are fixed and integrated.

2. The wiring module according to claim 1,
wherein the noise shielding member includes a magnetic material having such magnetic characteristics that an imaginary part of complex magnetic permeability between 1 GHz to 5 GHz is at least 5.

3. The wiring module according to claim 2,
wherein the magnetic material has such magnetic characteristics that an imaginary part of complex magnetic permeability at a frequency of 1 GHz is at least 10.

* * * * *